United States Patent [19]
Berna et al.

[11] Patent Number: 5,734,264
[45] Date of Patent: Mar. 31, 1998

[54] DEVICE FOR MEASURING ELECTRIC CURRENT, INCLUDING A SENSOR SENSITIVE TO MAGNETIC FLUX AND INTENDED IN PARTICULAR FOR ELECTRICALLY PROPELLED VEHICLES

[75] Inventors: Michel Berna, Lusigny; Luc Colombel, Mennecy; Rouelle Raholijaona, Villemandeur, all of France

[73] Assignee: MECAGIS, Montargis, France

[21] Appl. No.: 536,250

[22] Filed: Sep. 29, 1995

Related U.S. Application Data

[63] Continuation of PCT/FR94/00351 Mar. 29, 1994.

[30] Foreign Application Priority Data

Mar. 29, 1993 [FR] France ................... 93 03612

[51] Int. Cl.⁶ ............................. G01R 1/20; G01R 33/07
[52] U.S. Cl. ............................. 324/117 H; 324/127
[58] Field of Search ..................... 324/127, 126, 324/117 H, 117 R; 323/356, 357

[56] References Cited

U.S. PATENT DOCUMENTS

| | | | |
|---|---|---|---|
| 4,179,649 | 12/1979 | Karlin et al. | 320/13 |
| 4,639,665 | 1/1987 | Gary | 324/117 H |
| 5,103,163 | 4/1992 | McLyman | 324/117 H |
| 5,146,156 | 9/1992 | Marcel | 324/127 |
| 5,172,052 | 12/1992 | Wells | 324/117 R |

FOREIGN PATENT DOCUMENTS

| | | |
|---|---|---|
| 0 133 695 | 3/1985 | European Pat. Off. |
| 0 392 439 | 10/1990 | European Pat. Off. |
| 59-147415 | 8/1984 | Japan |
| 60-152012 | 8/1985 | Japan |

*Primary Examiner*—Ernest F. Karlsen
*Attorney, Agent, or Firm*—Cushman, Darby & Cushman IP Group of Pillsbury, Madison & Sutro LLP

[57] ABSTRACT

A device is provided for measuring electric current having at least one probe sensitive to magnetic flux arranged in the air gap of an annular core through which at least one conductor of a current to be measured is intended to pass. A compensation winding is wound of the core and a measuring resistor is connected in series with the compensation winding. A circuit is provided for regulating the supply current to the compensation winding regardless of the direction of the current to be measured. The circuit is controlled by the output signal of the sensor which is sensitive to magnetic flux.

16 Claims, 2 Drawing Sheets

DEVICE FOR MEASURING ELECTRIC CURRENT, INCLUDING A SENSOR SENSITIVE TO MAGNETIC FLUX AND INTENDED IN PARTICULAR FOR ELECTRICALLY PROPELLED VEHICLES

This is a continuation of International Application. No. PCT/FR94/00351 filed Mar. 29, 1994.

The present invention relates to a device for measuring electric current, including a sensor sensitive to magnetic flux and intended to measure the strength of an electric current flowing through at least one electrical conductor.

It is known that zero-flux Hall-effect current sensors are used for measuring the strength of alternating or direct electric currents, in particular in motor vehicles for measuring the strength of the electric current for charging and discharging the batteries.

Such sensors generally consist of a laminated magnetic core having at least one air gap and on which at least one zero-flux winding is arranged, of a Hall-effect probe housed in the air gap, supplied with direct current output by two symmetrical sources and delivering an output signal to the input of an electronic amplifier unit, the said amplifier being connected at output to one of the ends of the zero-flux winding, and of a resistor for measuring a so-called zero-flux current, which is connected, on the one hand, to the opposite end of the said zero-flux winding and, on the other hand, to the electrical earth.

The electric current to be measured is the one flowing through an electrical conductor around which the magnetic core of the current sensor is arranged.

In general, but in particular in electrical motor vehicles, these measuring devices are supplied by batteries having a rated voltage of 16 V, most often delivering voltages of between 9 and 16 V. Because of this, the measuring devices include, in addition to the magnetic core, the Hall-effect probe, the regulating loop and the measuring resistor, a DC—DC converter circuit intended to deliver voltages of +12 V and −12 V. This converter, the excursion of which between the two voltages must be greater than 18 V, because it is imposed by size of the magnetic circuit, and consequently the resistance of the compensation winding, or zero-flux coil, complicates the measuring device, increases its bulk and its cost price.

The object of the present invention is to overcome these drawbacks.

For this purpose, the subject matter of the present invention is a device for measuring electric current, comprising at least one probe sensitive to magnetic flux and arranged in the air gap of an annular core through which at least one conductor of a current to be measured is intended to pass, a compensation winding wound on the core, a measuring resistor connected in series with the compensation winding, characterized in that the magnetic core is a solid material element, in that it furthermore includes a circuit for regulating the supply current of the compensation winding, regardless of the direction of the current to be measured, and controlled by the output signal of the sensor which is sensitive to magnetic flux, and in that the number of turns of the compensation winding is made compatible with the current to be measured, the maximum available supply voltage and the measurement range of the measuring resistor of the device.

According to a first embodiment of the invention, the magnetic core has a toroidal shape, the mean diameter of this torus is between 10 and 200 mm and preferably between 30 and 50 mm for a calibre of 200 to 1000 A.

The solid element advantageously consists of a wire.

According to another embodiment of the invention, the solid element is a flat piece. Advantageously, this flat piece has a thickness of between 0.5 and 2 mm and a width of between 1 and 5 mm.

According to yet another embodiment of the invention, the solid element consists of a strip, the ends of which form the air gap between them and are raised towards the outside of the said solid element so as to face the Hall-effect probe. Advantageously, this strip has a thickness of between 0.1 and 0.5 mm and a width of between 2 and 5 mm.

Advantageously, the magnetic material is an alloy of iron and of nickel, for example having the following composition by weight:

Iron: 15%, nickel: 75% to 82%, molybdenum: 3% to 7%, copper: 0% to 5%.

Preferably, the magnetic material has the following composition:

Iron: 15%, nickel: 80%, molybdenum: 5%.

In addition, the magnetic material has, after its shaping and an optional thermal treatment, a coercive field of less than or equal to 10 mOe.

Other characteristics and advantages will emerge from the following description of exemplary embodiments of the invention, made with reference to the attached drawings, in which.

Figure 1:
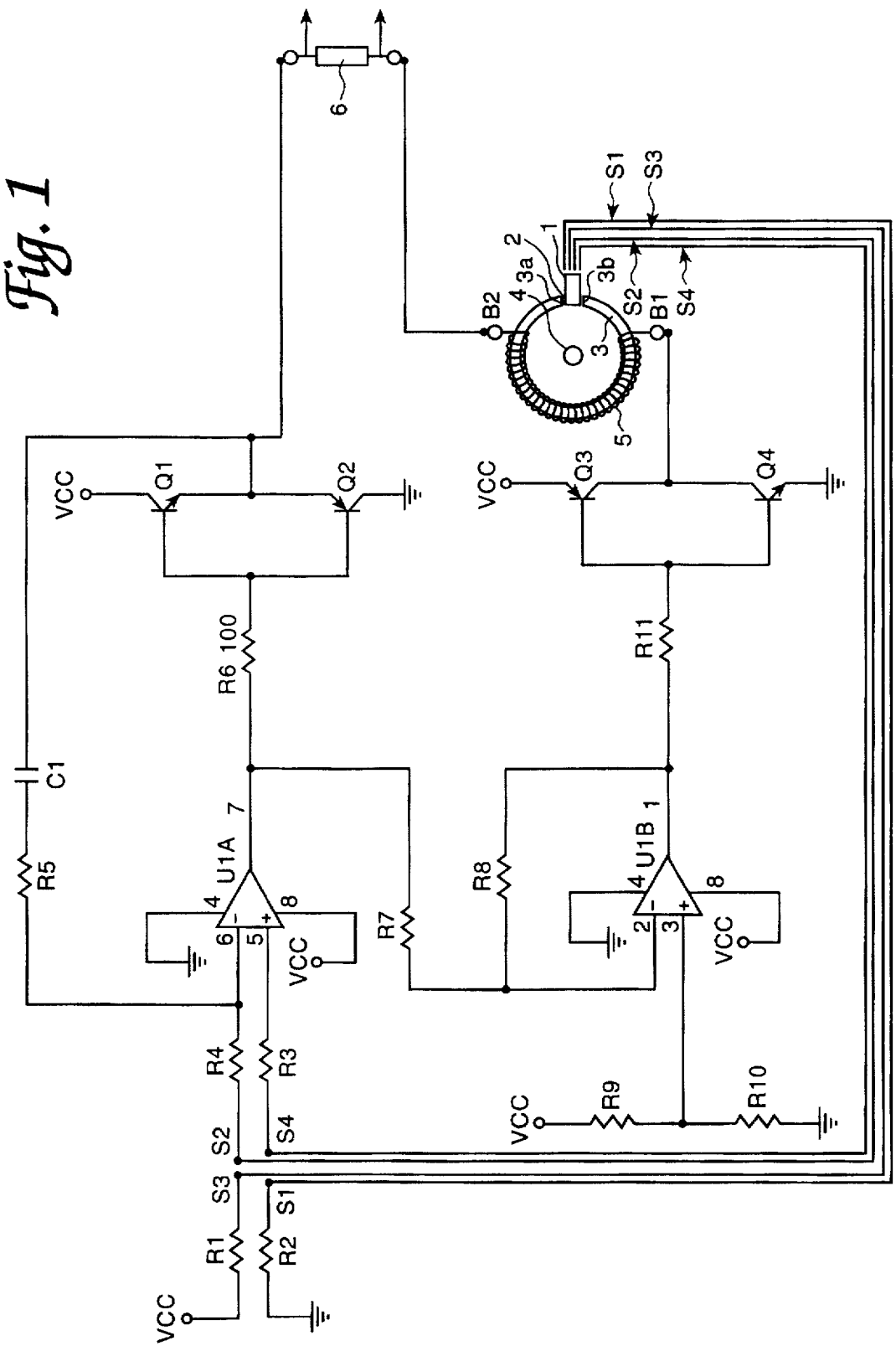
FIG. 1 represents the circuit diagram of a device according to the invention.

FIG. 1 represents a device for measuring electric current, including a probe 1, sensitive to magnetic flux, such as a Hall-effect sensor, for example, placed in the air gap 2 of an annular core 3 of general toroidal shape, for example.

The probe may also consist of a magnetoresistive element.

A conductor 4, through which a current to be measured flows, passes through the core 3 which carries a compensation winding 5.

The probe 1 includes two supply conductors S1, S3, by means of which it is connected to the terminals of a voltage Vcc supply source such as, for example, that available on board an electrical motor vehicle and which, although intended to deliver a rated voltage of 16 V, generally only delivers a voltage of between 9 and 16 V.

The probe 1 is connected to the supply source, respectively via bias resistors R1,R2.

The probe 1 furthermore includes two output conductors which are connected to the terminals S2,S4 of a regulating circuit comprising an amplifier supplied with the voltage Vcc, the inverting terminal of which is connected to the terminal S2 via a resistor R4, and the non-inverting terminal of which is connected to the input S4 via a resistor R3.

The output of the amplifier V1A is connected via a resistor R6 to the bases of a pair of transistors Q1,Q2 of NPN and PNP types, respectively, the emitter-collector paths of which are connected in series between the supply voltage Vcc and earth.

A series RC circuit comprising a resistor R5 and a capacitor C1 is connected between the junction of the emitters of the transistors Q1,Q2 and the inverting input of the amplifier U1A.

The junction point of the emitters of the transistors Q1,Q2 is furthermore connected to a first terminal of a measuring resistor 6, the other terminal of which is connected to a first terminal of the compensation winding 5.

The output of the amplifier U1A is furthermore connected via a resistor R7 to the inverting input of a second amplifier U1B. A resistor R8 connects this input of the amplifier U1B to its output.

The non-inverting input of this amplifier is connected to a voltage divider formed by resistors R9,R10 connected in series between the supply voltage Vcc and earth.

The amplifier U1B is also supplied by the voltage Vcc.

The output of the amplifier U1B is connected by a resistor R11 to the bases of a second pair of transistors Q3,Q4 of PNP and NPN types, respectively, the collector-emitter paths of which are connected in series between the supply voltage Vcc and earth, and the junction between the emitters of which is connected to the second terminal of the compensation winding 5.

The circuit which has just been described must satisfy a certain number of conditions.

Assuming that the current to be measured and flowing through the conductor 4 has a strength I1 and that the current flowing through the compensation winding 5, and consequently through the measuring resistor, has a strength I2 and that the compensation winding 5 includes n turns, $$I2 = \frac{I1}{n}$$

must be satisfied in order to obtain zero-flux operation.

With the measuring resistor 6 having a resistance Rm and the resistance of the compensation winding 5 having a value Rc, the relationship which must be satisfied is:

I2(Rm+Rc)<Vcc

Furthermore, the voltage across the terminals of the measuring resistor Vm=I2Rm is set at 5 V for the full scale of the current to be measured. This results in an absolute relationship to be adhered to over the entire available supply range and over the entire temperature range $$Rc < \frac{Vcc - Vm}{I1 \times n}$$

Now, the resistance Rc of the compensation winding depends on its length, and consequently on the diameter of the cross-section of the core 3 on which the compensation winding 5 is wound. Use of a solid magnetic material makes it possible considerably to reduce the cross-section of the core 3, so that with an equal number of turns relative to a winding wound on a conventional laminated core, a compensation winding of reduced resistance Rc is obtained.

The circuit which has just been described operates as follows.

It is first of all assumed that a current I1 to be measured flows through the conductor 4 in a first direction.

This current I1 creates a field in the core 3 which surrounds the conductor 4, which field is detected by the probe 1. The output voltage of the probe 1 is applied to the terminals S2,S4 and transmitted to the inputs of the amplifier U1A. The output signal of the amplifier U1A is applied to the bases of the transistors Q1,Q2, on the one hand, and via an amplifier U1B, which inverts it, to the bases of the transistors Q3 and Q4, on the other hand.

It is assumed, for example, that the sign of the output voltage of the probe 1 causes the appearance at the output of the amplification U1A, of a signal which unblocks the transistor Q1 and consequently keeps the conductor Q2 blocked.

This same output signal of the amplifier U1A, after inversion in the amplifier U1B, unblocks the transistor Q4.

As a consequence, the supply voltage Vcc is applied via the transistor Q1, which has been turned on, to the measuring resistor 6 and to the compensation winding 5, the current resulting therefrom flowing to earth via the emitter-collector path of the resistor Q4 which has also been turned on.

When the current to be measured, flowing through the conductor 4, is of opposite direction to that previously indicated, the output signal of the sensor 1 generates, at the output of the amplifier U1A, a signal of opposite sense to the preceding one, which causes the transistor Q2 to be turned on and blocks the transistor Q1.

Similarly, this same signal causes, after inversion in the amplifier U1B, the transistor Q3 to be turned on and blocking of the transistor Q4. Consequently, the voltage Vcc is applied this time to the compensation winding 5 and to the measuring resistor 5 in the opposite direction to the previous direction, and the current resulting therefrom flows to earth via the transistor Q2 which has been turned on.

It is therefore seen that it is thus possible to regulate the current flowing through the compensation winding 5 and through the measuring resistor 6 regardless of the direction of the current to be measured which flows through the conductor 4 passing through the core 3 of the device.

Advantageously, the magnetic core 3 is formed by a solid element of magnetic material which is, in this exemplary embodiment, a wire of circular cross-section.

For a wire of circular cross-section, use is made of a diameter of between 1.5 and 10 mm, preferably between 2 and 4 mm and, for example, equal to 2.4 mm.

The minimum condition required for the dimensions of the wire, or in general for the solid element 3, in line with the air gap 2 resides in the fact that the surface area of each end 3a or 3b of the solid element is at least equal to that of the active part of the Hall-effect probe 1. The wire 3 may also have a cross-section which is rectangular or of other suitable shape.

The torus has a mean diameter of between 10 and 200 mm, preferably between 30 and 50 mm for a calibre of 200 to 1000 A and, for example, equal to 32 mm.

The air gap 2 of the torus has a width of between 1.7 and 2.1 mm, for example, 1.9 mm.

The magnetic material is an alloy of iron and of nickel, having the following composition by weight:

Iron: 15%, nickel: 75% to 82%, molybdenum: 3% to 7%, copper: 0% to 5%.

The magnetic material preferably has the following composition:

Iron: 15%, nickel: 80%, molybdenum: 5%.

This magnetic material should have, after its shaping and an optional thermal treatment, a coercive field less than or equal to 10 mOe, in order to guarantee sufficient precision of the current sensor, this being between 0.1 and 1% over the entire measuring range.

Manufacture of such a magnetic core 3 can be summarized as working the wire, cutting it, shaping it to produce the torus, its thermal treatment and the operation of winding the compensation winding 5. It should be noted that the wire is previously covered with a varnish in order to prevent direct contact of the compensation winding 5 and the primary electrical conductor 4 with the magnetic material.

The compensation winding 5 consists of a copper wire having a diameter of between 0.15 and 0.25 mm and, for example, equal to 0.2 mm, wound around the torus 3 so as to form a number of turns equal, for example, to 2500.

The length of the wire is such that the total ohmic resistance is less than 20 ohms.

This winding 5 may be wound directly on the impregnated torus 3, without this requiring a protective casing.

Thus, the number of operations for manufacturing the magnetic core 3 is considerably reduced with respect to the techniques of the prior art, since it is reduced to two steps and therefore is easy to implement.

Furthermore, the manufacture of such a direct-current sensor affords a reduction of 50 to 75% in cost, according to the calibre in question, relative to a current sensor of the prior art.

This gain is distributed substantially equally between the raw material and the manufacturing steps of the current sensor.

In addition, the thermal treatment of the magnetic core 3 is carried out after shaping of the torus, which provides it with the optimum characteristics, for example a minimal coercive field, which are not impaired by subsequent shaping as in the case of the prior art.

In the embodiment described, the strength of the current to be measured is between 200 and 400 A and, for example, of the order of 300 A, the supply voltage varying from 9 to 16 V.

According to the prior art, a zero-flux Hall-effect current sensor such as that previously described comprises a toroidally shaped magnetic core consisting of a stack of, for example, ten washers of a magnetic material identical to the preceding one, with a thickness equal to 0.3 mm or 0.35 mm and a width equal to 6 mm.

The torus has a mean diameter equal to 32 mm, the zero-flux winding has a number of turns equal to 2000, made from a wire having a diameter equal to 0.15 mm.

Thus, the magnetic core 3 according to the invention and, for example, consisting of a wire, has a mechanical strength comparable to that provided by the stack of washers and makes it possible to minimize the volume of magnetic material employed for producing the core 3, thus leading to a decrease in weight of the current sensor, which is always an advantage in the transport field.

Furthermore, the length of the average turn of the compensation winding 5 has decreased considerably compared to the current sensor of the prior art, which makes it possible to reduce the resistance of this winding 5 by approximately 30% and simplify the electronic amplifier unit associated with the current sensor.

The invention makes it possible to decrease the stray capacitances due to the zero-flux winding 7 and therefore to increase the working frequencies.

The invention also makes it possible to reduce the supply voltage of the current sensor or probe 1 for a given current strength to be measured, volume of the sensor and full-scale voltage U across the terminals of the resistor. Thus, instead of using a −12 and +12 V supply, it is also possible to supply the current sensor with single voltage and, for example, with a battery supply voltage of 9 V.

Figure 2:
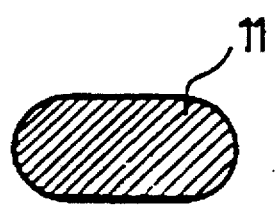
FIG. 2 represents, in section, another embodiment of the magnetic core.

According to a second embodiment, the magnetic core 3 may consist of a flat piece 11 as represented in FIG. 2.

This flat piece 11 has a thickness of between 0.5 and 2 mm, for example equal to 1 mm, and has a length of between 1 and 5 mm, for example equal to 3 mm.

Figure 3:
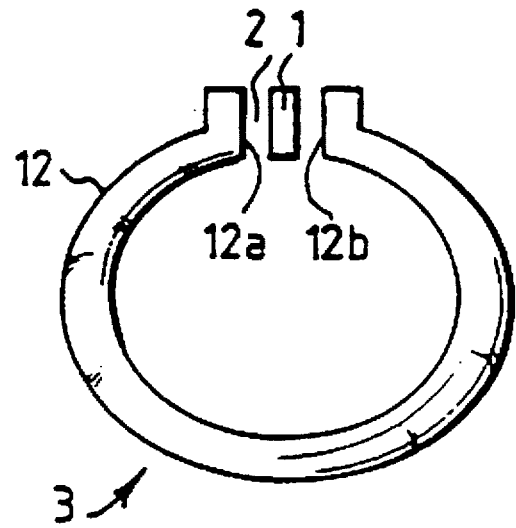
FIGS. 3 and 4 represent, in front and profile view, another embodiment of the invention.
Figure 4:
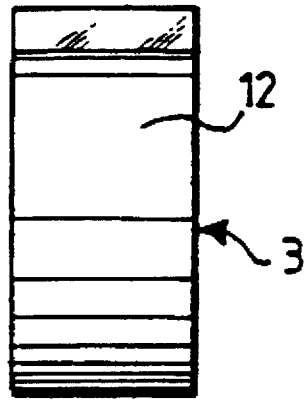

According to a third embodiment, illustrated by FIGS. 3 and 4, the solid element 3 of magnetic material is a strip 12 closed on itself so as to form a torus, and the ends 12a and 12b of which face each other, forming an air gap 4 between them.

The strip 12 has a thickness of between 0.1 and 0.5 mm and a width of between 2 and 5 mm, for example, the strip 12 has a thickness of 0.5 mm and a width of 3 mm.

These ends 12a, 12b are raised approximately at right angles relative to the rest of the strip 12 and are turned towards the outside of the torus (FIG. 3), thus affording a larger strip surface area opposite the active part of the Hall-effect probe 5 housed in the air gap 4.

The raised ends 12a and 12b have an equal height and are mutually parallel.

The width of these raised ends 12a and 12b is between 0.5 and 5 mm, is for example equal to 3 mm.

The height of these raised ends 12a and 12b is between 0.5 and 5 mm, is for example equal to 3 mm.

Figure 5:
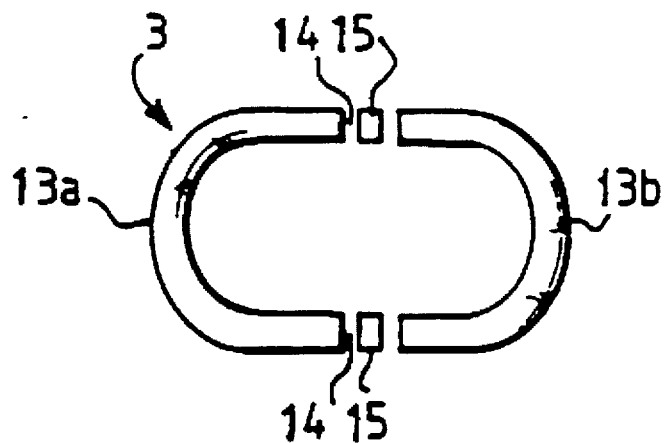
FIG. 5 illustrates yet another embodiment of the invention.

As represented in FIG. 5 according to a fourth embodiment, the magnetic core 3 is composed of two parts 13a, 13b, each having a U-shape, the branches of which face each other and form between them two air gaps 14 intended for housing two Hall-effect probes 15.

Each identical part 13a, 13b is formed by a wire, for example of circular cross-section having a diameter equal to 3 mm.

The current sensor according to the invention applies quite particularly to electrically propelled vehicles and makes it possible to measure the strength of direct, alternating, superposed direct and alternating and pulsed currents up to frequencies of a few tens of kHz, or even a few hundreds of kHz.

The preceding embodiments are in no way limiting and it is clearly understood that the magnetic core may assume various shapes other than the torus or double-U, it also being possible for the solid element constituting the said magnetic core to itself assume various forms, even those not described.

In addition, this technology can be applied perfectly to any other field while retaining the advantages linked with low manufacturing cost, low electrical current consumption and excellent precision in measuring the strength of the electrical current or currents.

We claim:

1. Device for measuring electric current, comprising:

an annular magnetic core, at least one probe sensitive to magnetic flux and arranged in an air gap of said annular magnetic core through which at least one conductor of a current to be measured is intended to pass, a compensation winding wound on said core, a measuring resistor connected in series with said compensation winding, said magnetic core being a solid material element, a regulating circuit for regulating the supply current of the compensation winding, regardless of the direction of the current to be measured, and controlled by the output signal of said at least one probe which is sensitive to magnetic flux, said regulating circuit being connected in series with said compensating winding and said measuring resistor and including a first amplifier to input terminals of which said probe is connected and an output of which is connected to bases of a first pair of transistors of PNP and NPN types having emitter-collector paths connected between a supply voltage Vcc and earth, a junction of the collectors of said transistors being connected in series with the measuring resistor to a first terminal of the compensation winding, and a second inverter amplifier connected by an inverting terminal to an output of the first amplifier, and the output of which is connected to bases of a second pair of transistors of PNP and NPN type, emitter-collector paths of which are connected in series with said supply voltage Vcc and earth, a junction of the collectors of said second pair of transistors being connected to the second terminal of the compensation winding, the number of turns of the compensation winding being compatible with the current to be measured, the maximum available supply voltage and the measurement range of the measuring resistor of the device.

2. Measuring device according to claim 1, wherein said magnetic core has a toroidal shape.

3. Measuring device according to claim 2, wherein said magnetic core has a mean diameter of between 10 and 200 mm and preferably between 30 and 50 mm for a calibre of 200 to 10000 A.

4. Measuring device according to claim 1, wherein the air gap of the magnetic core has a width of between 1.7 and 2.1 mm.

5. Measuring device according to claim 1, wherein said solid element consists of wire.

6. Measuring device according to claim 5, wherein said wire has a circular cross-section.

7. Measuring device according to claim 6, wherein said wire has a diameter of between 1.5 and 10 mm preferably between 2 and 4 mm.

8. Measuring device according to claim 1, wherein solid element is a flat piece.

9. Measuring device according to claim 8, wherein said flat piece has a thickness of between 0.5 and 2 mm and a width of between 1 and 5 mm.

10. Measuring device according to claim 1, wherein said solid element consists of a strip having ends which form the air gap between them and are raised towards the outside of said solid element so as to face said probe.

11. Measuring device according to claim 10, wherein said strip has a thickness of between 0.1 and 0.5 mm and a width of between 2 and 5 mm.

12. Measuring device according to claim 10, wherein the raised ends of the strip afford a surface opposite the measuring probe, the width of which is between 2 and 5 mm and the height of which is between 0.5 and 5 mm.

13. Measuring device according to claim 1, wherein said magnetic material is an alloy of iron and of nickel.

14. Measuring device according to claim 13, wherein said alloy has the following composition by weight:

Iron: 15%, nickel: 75% to 82%, molybdenum: 3% to 7% copper: 0% to 5%.

15. Measuring device according to claim 1, wherein said magnetic core is composed of two parts, each having a U-shape including branches which face each other and form two air gaps between them, each receiving one measuring probe.

16. Measuring device according to claim 1, wherein said magnetic material has, after its shaping and an optional thermal treatment, a coercive field of less than or equal to 10 mOe.

* * * * *